(12) United States Patent
El-Hinnawy et al.

(10) Patent No.: US 11,159,145 B2
(45) Date of Patent: Oct. 26, 2021

(54) RADIO FREQUENCY (RF) FILTERING USING PHASE-CHANGE MATERIAL (PCM) RF SWITCHES

(71) Applicant: Newport Fab, LLC, Newport Beach, CA (US)

(72) Inventors: Nabil El-Hinnawy, Irvine, CA (US); Chris Masse, Irvine, CA (US); Gregory P. Slovin, Irvine, CA (US); David J. Howard, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 16/418,130

(22) Filed: May 21, 2019

(65) Prior Publication Data

US 2020/0059219 A1 Feb. 20, 2020

Related U.S. Application Data

(63) Continuation-in-part of application No. 16/161,960, filed on Oct. 16, 2018, and a continuation-in-part of
(Continued)

(51) Int. Cl.
*H03H 11/04* (2006.01)
*H01L 45/00* (2006.01)
(Continued)

(52) U.S. Cl.
CPC ......... *H03H 11/04* (2013.01); *H01L 27/2463* (2013.01); *H01L 45/06* (2013.01);
(Continued)

(58) Field of Classification Search
None
See application file for complete search history.

(56) References Cited

U.S. PATENT DOCUMENTS

| 5,976,932 A | 11/1999 | Kerber |
| 6,448,576 B1 | 9/2002 | Davis |

(Continued)

FOREIGN PATENT DOCUMENTS

| WO | WO 2016/028362 | 2/2016 |

OTHER PUBLICATIONS

"Constant-K LC Low Pass Filter Circuit Design & Calculations" by Electronics Notes accessed Mar. 11, 2020, first available Nov. 19, 2018 (Year: 2018).*

(Continued)

*Primary Examiner* — Evren Seven
(74) *Attorney, Agent, or Firm* — Farjami & Farjami LLP

(57) ABSTRACT

In a first approach, a reconfigurable radio frequency (RF) filtering module includes a phase-change material (PCM) RF switch bank and an RF filter bank. Each RF filter in the RF filter bank is capable to be engaged and disengaged by a PCM RF switch in the PCM RF switch bank. In a second approach, a tunable RF filter includes PCM RF switches and a capacitor and/or an inductor. Each of the capacitor and/or inductor is capable to be engaged and disengaged by at least one PCM RF switch of the PCM RF switches. In a third approach, an adjustable passive component includes multiple segments and a PCM RF switch. A selectable segment in the multiple segments is capable to be engaged and disengaged by the PCM RF switch. In all approaches, each PCM RF switch includes a PCM and a heating element transverse to the PCM.

20 Claims, 10 Drawing Sheets

Related U.S. Application Data application No. 16/114,106, filed on Aug. 27, 2018, and a continuation-in-part of application No. 16/103,587, filed on Aug. 14, 2018, now Pat. No. 10,461,253, and a continuation-in-part of application No. 16/103,646, filed on Aug. 14, 2018, now Pat. No. 10,475,993, and a continuation-in-part of application No. 16/103,490, filed on Aug. 14, 2018, now Pat. No. 10,476,001.

(51) Int. Cl.
  *H01L 27/24* (2006.01)
  *H03H 1/00* (2006.01)

(52) U.S. Cl.
  CPC .......... *H01L 45/1286* (2013.01); *H03H 1/00* (2013.01); *H01L 45/143* (2013.01); *H01L 45/144* (2013.01); *H03H 2001/0064* (2013.01)

(56) References Cited

U.S. PATENT DOCUMENTS

| | | | |
|---|---|---|---|
| 6,535,545 B1 | 3/2003 | Ben-Bassat | |
| 7,522,029 B1 | 4/2009 | Lantz | |
| 8,314,983 B2 | 11/2012 | Frank | |
| 8,614,472 B1* | 12/2013 | Islam | H01L 23/5223 257/312 |
| 9,257,647 B2 | 2/2016 | Borodulin | |
| 9,362,492 B2 | 6/2016 | Goktepeli | |
| 9,368,720 B1 | 6/2016 | Moon et al. | |
| 9,444,430 B1* | 9/2016 | Abdo | H01L 39/223 |
| 9,601,545 B1 | 3/2017 | Tu | |
| 9,640,759 B1 | 5/2017 | Curioni | |
| 9,673,155 B2* | 6/2017 | Smith | H03H 7/1758 |
| 9,891,112 B1 | 2/2018 | Abel | |
| 9,917,104 B1 | 3/2018 | Roizin | |
| 10,128,243 B2 | 11/2018 | Yoo | |
| 10,164,608 B2 | 12/2018 | Belot | |
| 10,269,735 B1* | 4/2019 | Shukla | H03H 11/28 |
| 10,461,253 B1 | 10/2019 | Slovin | |
| 10,529,922 B1 | 1/2020 | Howard | |
| 2004/0113232 A1 | 6/2004 | Johnson et al. | |
| 2005/0127348 A1 | 6/2005 | Horak | |
| 2005/0212090 A1 | 9/2005 | Friedrich et al. | |
| 2006/0246712 A1 | 11/2006 | Kim | |
| 2007/0075347 A1 | 4/2007 | Lai | |
| 2007/0099405 A1 | 5/2007 | Oliva et al. | |
| 2008/0042243 A1* | 2/2008 | Lee | H01L 45/1683 257/613 |
| 2008/0142775 A1 | 6/2008 | Chen | |
| 2009/0115052 A1 | 5/2009 | Treece et al. | |
| 2010/0084626 A1 | 4/2010 | Delhougne | |
| 2010/0238720 A1 | 9/2010 | Tio Castro | |
| 2011/0291784 A1* | 12/2011 | Nakatsuji | H01F 17/0013 336/192 |
| 2013/0187120 A1 | 7/2013 | Redaelli | |
| 2013/0285000 A1 | 10/2013 | Arai | |
| 2014/0191181 A1 | 7/2014 | Moon | |
| 2014/0264230 A1 | 9/2014 | Borodulin | |
| 2014/0339610 A1 | 11/2014 | Rashed | |
| 2015/0022938 A1 | 1/2015 | Okada et al. | |
| 2015/0048424 A1 | 2/2015 | Tien | |
| 2015/0090949 A1 | 4/2015 | Chang | |
| 2015/0333131 A1 | 11/2015 | Mojumder | |
| 2016/0035973 A1 | 2/2016 | Raieszadeh | |
| 2016/0056373 A1 | 2/2016 | Goktepeli | |
| 2016/0071653 A1 | 3/2016 | Lamorey | |
| 2016/0225509 A1* | 8/2016 | Mattsson | H01F 27/2804 |
| 2016/0300612 A1 | 10/2016 | Manipatruni et al. | |
| 2016/0308507 A1 | 10/2016 | Engelen | |
| 2017/0092694 A1 | 3/2017 | BrightSky | |
| 2017/0126205 A1* | 5/2017 | Lin | H03H 11/04 |
| 2017/0187347 A1 | 6/2017 | Rinaldi | |
| 2017/0207764 A1 | 7/2017 | Wang | |
| 2017/0243861 A1 | 8/2017 | Wang | |
| 2017/0365427 A1 | 12/2017 | Borodulin | |
| 2018/0005786 A1 | 1/2018 | Navarro | |
| 2018/0138894 A1 | 5/2018 | Belot | |
| 2018/0194615 A1 | 7/2018 | Nawaz | |
| 2018/0269393 A1 | 9/2018 | Zhang | |
| 2019/0064555 A1 | 2/2019 | Hosseini | |
| 2019/0067572 A1 | 2/2019 | Tsai | |
| 2019/0172657 A1 | 6/2019 | Zhu | |
| 2019/0267214 A1* | 8/2019 | Liu | H01J 37/32229 |
| 2019/0296718 A1 | 9/2019 | Birkbeck et al. | |

OTHER PUBLICATIONS

"Phase-change RF switches with Robust Switching Cycle Endurance" By Moon et al. (Year: 2018).*

G. Slovin, et al., "Design Criteria in Sizing Phase-Change RF Switches," in *IEEE Transactions on Microwave Theory and Techniques*, vol. 65, No. 11, pp. 4531-4540, Nov. 2017.

N. El-Hinnawy et al., "A 7.3 THz Cut-Off Frequency, Inline, Chalcogenide Phase-Change RF Switch Using an Independent Resistive Heater for Thermal Actuation," *2013 IEEE Compound Semiconductor Integrated Circuit Symposium (CSICS)*, Monterey, CA, 2013, pp. 1-4.

G. Slovin, et al. "AlN Barriers for Capacitance Reduction in Phase-Change RF Switches," in *IEEE Electron Device Letters*, vol. 37, No. 5, pp. 568-571, May 2016.

Moon, et al. "Phase-Change RF Switches with Robust Switching Cycle Endurance," *2018 IEEE Radio and Wireless Symposium (RWS)*, pp. 231-233, Jan. 2018, Anaheim, CA.

Wang, et al. "Directly Heated Four-Terminal Phase Change Switches," *2014 IEEE MTT-S International Microwave Symposium (IMS2014)*, pp. 1-4, Jun. 2014, Tampa, FL.

Tombak, et al. "Cellular Antenna Switches for Multimode Applications Based on a Silicon-on-Insulator Technology," *2010 IEEE Radio Frequency Integrated Circuits Symposium (RFIC)*, pp. 271-274, May 2010, Anaheim, CA.

"Phase-change RF switches with Robust Switching Cycle Endurance" by Moon et al. (IEEE 2018).

"Highly Reconfigurable Aluminum Nitride MEMS Resonator Using 12 Monolithically Integrated Phase Change Material Switches" by Hummel et al. (IEEE 2015).

"Switchable Aluminum Nitride MEMS Resonator Using Phase Change Materials" by Hummel et al. (TRF 2014).

* cited by examiner

RADIO FREQUENCY (RF) FILTERING USING PHASE-CHANGE MATERIAL (PCM) RF SWITCHES

CLAIMS OF PRIORITY

The present application is a continuation-in-part of and claims the benefit of and priority to application Ser. No. 16/103,490 filed on Aug. 14, 2018, titled "Manufacturing RF Switch Based on Phase-Change Material." The present application is also a continuation-in-part of and claims the benefit of and priority to application Ser. No. 16/103,587 filed on Aug. 14, 2018, titled "Design for High Reliability RF Switch Based on Phase-Change Material." The present application is also a continuation-in-part of and claims the benefit of and priority to application Ser. No. 16/103,646 filed on Aug. 14, 2018, titled "PCM RF Switch Fabrication with Subtractively Formed Heater." The present application is further a continuation-in-part of and claims the benefit of and priority to application Ser. No. 16/114,106 filed on Aug. 27, 2018, titled "Fabrication of Contacts in an RF Switch Having a Phase-Change Material (PCM) and a Heating Element." The present application is also a continuation-in-part of and claims the benefit of and priority to application Ser. No. 16/161,960 filed on Oct. 16, 2018, titled "Phase-Change Material (PCM) Radio Frequency (RF) Switch with Reduced Parasitic Capacitance." The disclosures and contents of all of the above-identified applications are hereby incorporated fully by reference into the present application.

BACKGROUND

Radio frequency (RF) filtering techniques using filters and passive components may employ switches for engaging and disengaging various types of filters (e.g., resonators) and/or passive components (e.g., inductors) to achieve flexibility in RF filtering. Moreover, in various applications it is desirable to use switches to properly reconfigure or tune an individual RF filter.

Integrating such switches in RF filtering solutions generally results in disadvantageous and significant performance tradeoffs. For example, conventional switches, and conventional techniques used to integrate the switches, introduce significant insertion losses. Where the RF filtering technique employs numerous switches corresponding to numerous filters and/or passive components, these losses can prohibit RF filtering as intended. Further, conventional switches are typically volatile and do not maintain their state during power off. Conventional switches may also be unreliable and vary over time.

Thus, there is need in the art for reconfigurable and tunable RF filtering solutions with low insertion losses that are also non-volatile and reliable.

SUMMARY

The present disclosure is directed to radio frequency (RF) filtering using phase-change material (PCM) RF switches, substantially as shown in and/or described in connection with at least one of the figures, and as set forth in the claims.

DETAILED DESCRIPTION

Figure 1:
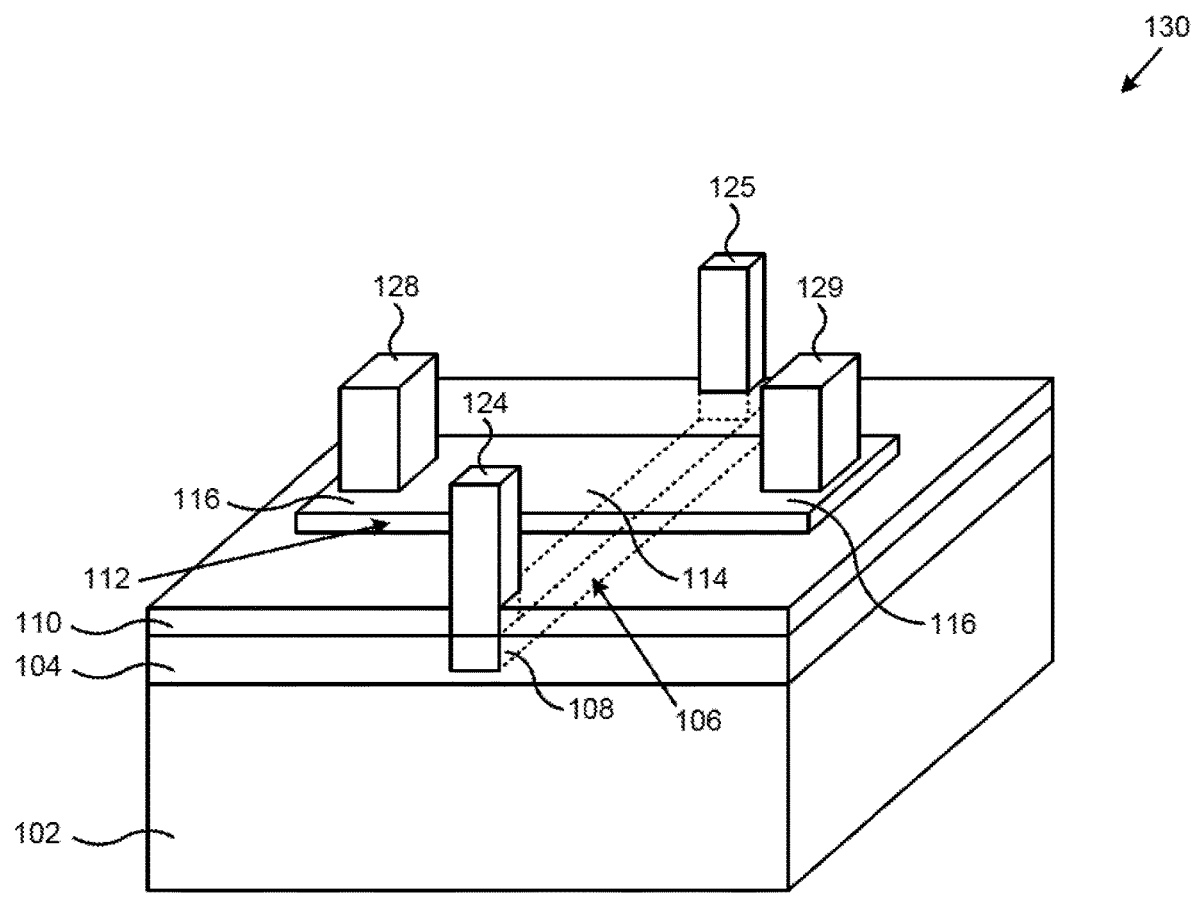
FIG. 1 illustrates a perspective view of a portion of a phase-change material (PCM) radio frequency (RF) switch according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 illustrates a perspective view of a portion of a phase-change material (PCM) radio frequency (RF) switch according to one implementation of the present application. As shown in FIG. 1, PCM RF switch 130 includes substrate 102, lower dielectric 104, heating element 106 having terminal segments 108, thermally conductive and electrically insulating material 110, PCM 112 having active segment 114 and passive segments 116, PCM contacts 128 and 129, and heater contacts 124 and 125. For purposes of illustration, the perspective view in FIG. 1 shows selected structures of PCM RF switch 130. PCM RF switch 130 may include other structures not shown in FIG. 1.

Substrate 102 is situated under lower dielectric 104. In one implementation, substrate 102 is an insulator, such as silicon oxide ($SiO_2$). In various implementations, substrate 102 is a silicon (Si), silicon-on-insulator (SOI), sapphire, complementary metal-oxide-semiconductor (CMOS), bipolar CMOS (BiCMOS), or group III-V substrate. In various implementations, substrate 102 includes a heat spreader or substrate 102 itself performs as a heat spreader. Substrate 102 can have additional layers (not shown in FIG. 1). In one implementation, substrate 102 can comprise a plurality of interconnect metal levels and interlayer dielectric layers. Substrate 102 can also comprise a plurality of devices, such as integrated passive devices (not shown in FIG. 1).

Lower dielectric 104 in PCM RF switch 130 is situated above substrate 102 and below thermally conductive and electrically insulating material 110. As shown in FIG. 1, lower dielectric 104 is also adjacent to sides of heating element 106. Lower dielectric 104 extends along the width of PCM RF switch 130, and is also coplanar with the top of heating element 106. Because PCM RF switch 130 includes lower dielectric 104 on the sides of heating element 106, less heat transfers horizontally (i.e., from the sides) and more heat dissipates vertically, from heating element 106 toward active segment 114 of PCM 112. In various implementations, lower dielectric 104 can have a relative width and/or a relative thickness greater or less than shown in FIG. 1. Lower dielectric 104 can comprise any material with thermal conductivity lower than that of thermally conductive and electrically insulating material 110.

Heating element 106 in PCM RF switch 130 is situated in lower dielectric 104. Heating element 106 also approximately defines active segment 114 of PCM 112. Heating element 106 generates a crystallizing heat pulse or an amorphizing heat pulse for transforming active segment 114 of PCM 112. Heating element 106 can comprise any material capable of Joule heating. Heating element 106 can be connected to electrodes of a pulse generator (not shown in FIG. 1) that generates voltage or current pulses. Preferably, heating element 106 comprises a material that exhibits minimal or substantially no electromigration, thermal stress migration, and/or agglomeration. In various implementations, heating element 106 can comprise tungsten (W), molybdenum (Mo), titanium (Ti), titanium tungsten (TiW), titanium nitride (TiN), tantalum (Ta), tantalum nitride (TaN), nickel chromium (NiCr), or nickel chromium silicon (NiCrSi). For example, in one implementation, heating element 106 comprises tungsten lined with titanium and titanium nitride.

Thermally conductive and electrically insulating material 110 in PCM RF switch 130 is situated on top of hearing element 106 and lower dielectric layer, and under PCM 112 and, in particular, under active segment 114 of PCM 112. Thermally conductive and electrically insulating material 110 ensures efficient heat transfer from heating element 106 toward active segment 114 of PCM 112, while electrically insulating heating element 106 from PCM contacts 128 and 129, PCM 112, and other neighboring structures.

Thermally conductive and electrically insulating material 110 can comprise any material with high thermal conductivity and high electrical resistivity. In various implementations, thermally conductive and electrically insulating material 110 can comprise silicon carbide ($Si_XC_Y$), aluminum nitride ($Al_XN_Y$), aluminum oxide ($Al_XO_Y$), beryllium oxide ($Be_XO_Y$), diamond, or diamond-like carbon. In one implementation, thermally conductive and electrically insulating material 110 can be a nugget that does not extend along the width of PCM RF switch 130. For example, thermally conductive and electrically insulating material 110 can be a nugget approximately aligned with heating element 106.

PCM 112 in PCM RF switch 130 is situated on top of thermally conductive and electrically insulating material 110. PCM RF switch 130 utilizes PCM 112 to transfer input RF signals in an ON slate and to block input RF signals in an OFF state. PCM 112 includes active segment 114 and passive segments 116. Active segment 114 of PCM 112 is approximately defined by heating element 106. Passive segments 116 of PCM 112 extend outward and are transverse to heating element 106, and are situated approximately under PCM contacts 128 and 129. As used herein, "active segment" refers to a segment of PCM that transforms between crystalline and amorphous phases, for example, in response to a crystallizing or an amorphizing heat pulse generated by heating element 106, whereas "passive segment" refers to a segment of PCM that does not make such transformation and maintains a crystalline phase (i.e., maintains a conductive state).

With proper heat pulses and heat dissipation, active segment 114 of PCM 112 can transform between crystalline and amorphous phases, allowing PCM switch 130 to switch between ON and OFF states respectively. Active segment 114 of PCM 112 must be heated and rapidly quenched in order for PCM RF switch 130 to switch states. If active segment 114 of PCM 112 does not quench rapidly enough, it will not transform, and PCM RF switch 130 will fail to switch states. How rapidly active segment 114 of PCM 112 must be quenched depends on the material, volume, and temperature of PCM 112. In one implementation, the quench time window can be approximately one hundred nanoseconds (100 ns) or greater or less.

PCM 112 can comprise germanium telluride ($Ge_XTe_Y$), germanium antimony telluride ($Ge_XSb_YTe_Z$), germanium selenide ($Ge_XSe_Y$), or any other chalcogenide. In various implementations, PCM 112 can be germanium telluride having from forty percent to sixty percent germanium by composition (i.e., $Ge_XTe_Y$, where $0.4 \leq X \leq 0.6$ and $Y=1-X$). The material for PCM 112 can be chosen based upon ON state resistivity, OFF state electric field breakdown voltage, crystallization temperature, melting temperature, or other considerations. It is noted that in FIG. 1, heating element 106 is transverse to PCM 112. Heating element 106 is illustrated with dashed lines as seen through various structures of PCM RF switch 130. Current flowing in heating element 106 flows approximately under active segment 114 of PCM 112.

PCM contacts 128 and 129 in PCM RF switch 130 are connected to passive segments 116 of PCM 112. Similarly, heater contacts 124 and 125 are connected to terminal segments 108 of heating element 106. PCM contacts 128 and 129 provide RF signals to and from PCM 112. Heater contacts 124 and 125 provide power to heating element 106 for generating a crystallizing heat pulse or an amorphizing heat pulse. In various implementations, PCM contacts 128 and 129 and heater contacts 124 and 125 can comprise tungsten (W), copper (Cu), or aluminum (Al). PCM contacts 128 and 129 and heater contacts 124 and 125 can extend through various dielectric layers (not shown in FIG. 1). In one implementation, in order to ensure uniform contact between PCM 112 and PCM contacts 128 and 129, PCM contacts 128 and 129 can extend through a contact uniformity support layer (not shown in FIG. 1) situated on top of PCM 112, as disclosed in U.S. patent application Ser. No. 16/103,490 filed on Aug. 14, 2018, titled "Manufacturing RF Switch Based on Phase-Change Material." The disclosure and content of the above-identified application are incorporated fully by reference into the present application.

PCM RF switch 130 has low insertion loss and is able to provide several advantages. First, PCM 112 in the crystalline state has low resistivity, while PCM 112 in the amorphous state has high resistivity. In various implementations, the OFF state resistance ($R_{OFF}$) of PCM RF switch 130 can range from approximately ten kilo-Ohms to approximately one mega-Ohm (10 kΩ-1 MΩ), while the ON state resistance ($R_{ON}$) of PCM RF switch 130 can be approximately one Ohm (1Ω) or less.

Second, where an optional contact uniformity support layer is utilized as described above, PCM 112 will remain substantially intact, and PCM contacts 128 and 129 can uniformly contact passive segments 116 of PCM 112. Because the $R_{ON}$ of a PCM RF switch, such as PCM RF switch 130 in FIG. 1, depends heavily on the uniformity of contacts made with PCM 112, the $R_{ON}$ will be significantly lower when an optional contact uniformity support layer is used.

Third, because PCM RF switch 130 includes lower dielectric 104 adjacent to sides of heating element 106, more heat dissipates vertically from heating element 106. Lower dielectric 104 under heating element 106 also performs as a heat valve that biases vertical heat dissipation from heating element 106 toward active segment 114 of PCM 112, rather than toward substrate 102, enabling PCM RF switch 130 to transition between OFF and ON states using even lower power and/or even quicker pulses. Thus, passive segments 116 are subjected to less thermal cycling consequences, and can be spaced more closely to decrease $R_{ON}$, as disclosed in U.S. patent application Ser. No. 16/103,587 filed on Aug. 14, 2018, titled "Design for High Reliability RF Switch Based on Phase-Change Material." The disclosure and content of the above-identified application are incorporated fully by reference into the present application.

Fourth, PCM contacts 128 and 129 can be formed crosswise to heating element contacts 124 and 125, further reducing parasitic capacitive coupling. This reduction in parasitic capacitance values of PCM RF switch 130 is disclosed and described in U.S. patent application Ser. No. 16/161,960 filed on Oct. 16, 2018, titled "Phase-Change Material (PCM) Radio Frequency (RF) Switch with Reduced Parasitic Capacitance." The disclosure and content of the above-identified application are incorporated fully by reference into the present application.

In addition to having low insertion loss and the other advantages described above, PCM RF switch 130 is advantageously non-volatile. That is, PCM 112 maintains its crystalline (ON state) or amorphous phase (OFF state) even when power is not supplied to heating element 106. PCM RF switch 130 requires less power than conventional switches when remaining in an ON state. Also, PCM RF switch 130 is resilient to voltage fluctuations in its programming, making PCM RF switch 130 particularly applicable in antenna tuners and other circuits which might experience large voltage fluctuations.

Figure 2A:
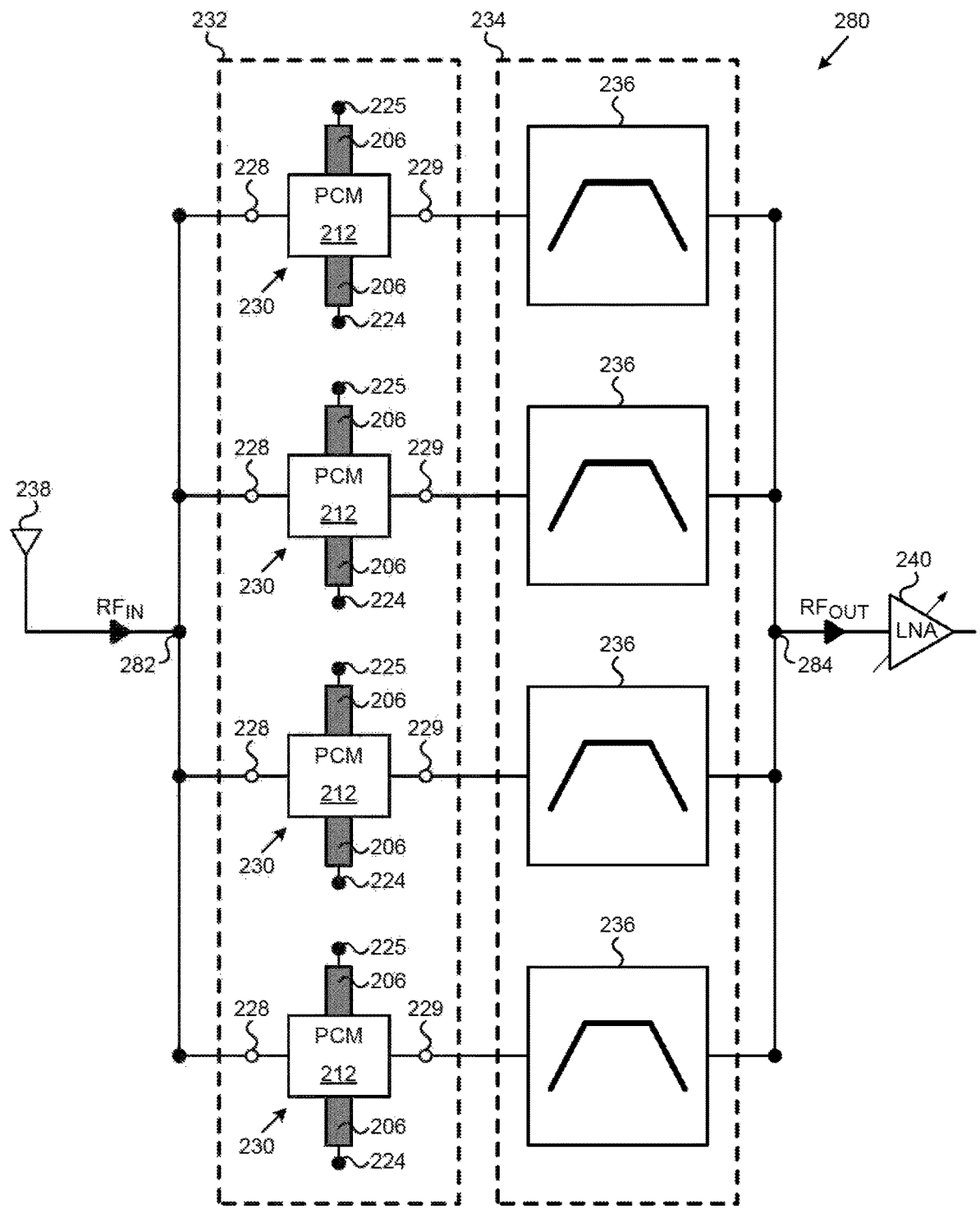
FIG. 2A illustrates a portion of an RF receive chain including a reconfigurable RF filtering module employing PCM RF switches according to one implementation of the present application.

FIG. 2A illustrates a portion of an exemplary RF receive chain including reconfigurable RF filtering module 280 employing PCM RF switches according to one implementation of the present application. The exemplary RF receive chain shown in FIG. 2A includes reconfigurable RF filtering module 280 situated between antenna 238 and low-noise amplifier (LNA) 240. Reconfigurable RF filtering module 280 includes PCM RF switch bank 232 and RF filter bank 234.

PCM RF switch bank 232 includes PCM RF switches 230. Each PCM RF switch 230 includes heating element 206, PCM 212, PCM contacts 228 and 229, and heater contacts 224 and 225. PCM 212 is situated over and transverse to heating element 206. As described above, heater contacts 224 and 225 provide power to heating element 206 for generating a crystallizing heat pulse or an amorphizing heat pulse for transforming an active segment of PCM 212 between crystalline and amorphous phases, thereby switching PCM RF switch 230 between ON and OFF states respectively. Heater contacts 224 and 225 can be connected to electrodes of a pulse generator (not shown in FIG. 2A) that generates voltage or current pulses. Each PCM RF switch 230 in FIG. 2A generally corresponds to PCM RF switch 130 in FIG. 1, and may have any implementations or advantages described above.

RF filter bank 234 includes RF filters 236. RF filters 236 attenuate undesired frequencies and pass desired frequencies of input RF signals. Each RF filter 236 can have a different frequency response. For example, one RF filter 236 can pass frequencies between seven hundred megahertz and eight bundled megahertz (700 MHz-800 MHz), while another RF filter 236 can pass frequencies between two thousand three hundred megahertz and two thousand four hundred megahertz (2300 MHz-2400 MHz). In various implementations, RF filters 236 can be implemented using bulk acoustic wave (BAW) filters, surface acoustic wave (SAW) filters, LC filters, active filters, passive filters, cavity filters, waveguide filters, or lumped element filters.

RF filters 236 are shown as bandpass filters in FIG. 2A. However, RF filters 236 may be any other types of filters. For example, RF filters 236 can be low-pass filters or high-pass filters with different cutoff frequencies. As another example, RF filters 236 can be bandstop filters with different stop bands. As yet another example, RF filters 236 can be tunable RF filters capable of passing selected frequencies within different ranges.

Each RF filter 236 in RF filter bank 234 is capable to be engaged and disengaged by a PCM RF switch 230 in PCM RF switch bank 232. As used herein, "engaged" refers to having a very low resistance electrical connection to other parts of a circuit through a connecting PCM RF switch 230, e.g., when the PCM RF switch 230 in the path of the RF filter 236 is in an ON (very low resistance) state. Further, "disengaged" refers to when the PCM RF switch 230 is in an OFF (very high resistance) state.

When PCM RF switch 230 is in an OFF state, an active segment of PCM 212 is in an amorphous phase, has high resistivity, and does not easily conduct electrical current. An RF signal received at RF input 282 of the reconfigurable RF filtering module 280 does not propagate across PCM RF switch 230, through PCM contact 228, PCM 212, and PCM contact 229, to RF filter 236. Accordingly, when PCM RF switch 230 is in an OFF state, PCM RF switch 230 disengages RF filter 236.

When PCM RF switch 230 is in an ON state, PCM 212 is in a crystalline phase, has low resistivity, and is able to easily conduct electrical current. An RF signal received at RF input 282 of reconfigurable RF filtering module 280 propagates across PCM RF switch 230 through PCM contact 228, PCM 212, and PCM contact 229, to RF filter 236. Accordingly, when PCM RF switch 230 is in an ON state, PCM RF switch 230 engages RF filter 236.

In reconfigurable RF filtering module 280, each RF filter 236 is in a "series configuration" with a PCM RF switch 230. When engaged, RF filter 236 attenuates undesired frequencies and passes desired frequencies from input RF signals to RF output 284. Thus, the frequency response of reconfigurable RF filtering module 280 is based on which RF filter 236 is engaged. In various implementations, RF filters 236 can have different frequency responses corresponding to RF bands used by different countries, RF bands used by different communications protocols, and/or RF bands used by different service providers. For example, in response to a change in country, communication protocol, or service provider, RF filters 236 can be engaged or disengaged by PCM RF switches 230 such that the frequency band accommodated by reconfigurable RF filtering module 280 matches the RF bands used by the current country, communications protocol, or service provider. Thus, PCM RF switches 230 in RCM RF switch bank 232 are capable of appropriately reconfiguring RF filtering module 280.

In FIG. 2A, RF input 282 of reconfigurable RF filtering module 280 is coupled to antenna 238, while RF output 284 of reconfigurable RF filtering module 280 is coupled to LNA 240. In one implementation, RF input 282 can be coupled to an antenna array. In one implementation, reconfigurable RF filtering module 280 can be used in an RF transmit chain. In a transmit chain, RF input 282 can be coupled to a variable gain amplifier (VGA) and RF output 284 can be coupled to an antenna. In various implementations, reconfigurable RF filtering module 280 can have multiple inputs and/or multiple outputs. In various implementations, a second PCM RF switch bank can be coupled between RF filter bank 234 and RF output 284, instead of or in addition to PCM RF switch bank 232 coupled between RF input 282 and RF filter bank 234. In various implementations, a PCM RF switch 230 can engage and disengage two or more RF filters 236, or two or more PCM RF switches 230 can engage and disengage an RF filter.

Because reconfigurable RF filtering module 280 utilizes PCM RF switches 230, it advantageously exhibits lower insertion loss, lower power consumption, and non-volatility compared to a reconfigurable RF filtering module using conventional RF switches. Due to the advantageous use of PCM RF switches, reconfigurable RF filtering module 280 allows the use of more switches, and thus more reconfigurations, for a given loss parameter, or conversely, lowers losses for a given number of switches. Reconfigurable RF filtering module 280 also enables non-volatile applications for RF filtering. For example, a mobile device including reconfigurable RF filtering module 280 can engage an RF filter 236 corresponding to an RF band used in the United States prior to sale of the mobile device in order to pre-program reconfigurable RF filtering module 280, while also maintaining the ability to reconfigure reconfigurable RF filtering module 280 to filter for an RF band used in Japan. As another example, a PCM RF switch 230 can be remain in a conductive state while the mobile device is powered off, so that an RF filter 236 is already engaged upon starting-up and powering on the mobile device.

Figure 2B:
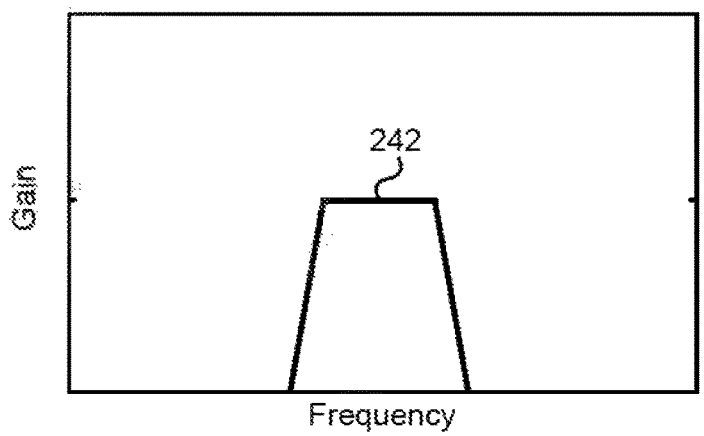
FIGS. 2B, 2C, and 2D illustrate frequency response graphs according to one implementation of the present application.
Figure 2C:
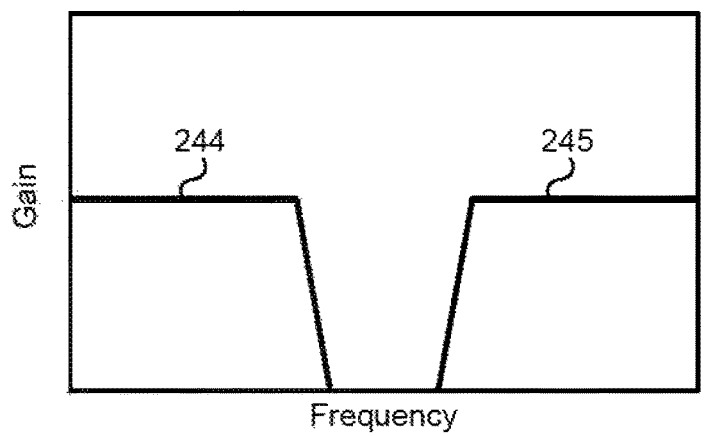
Figure 2D:
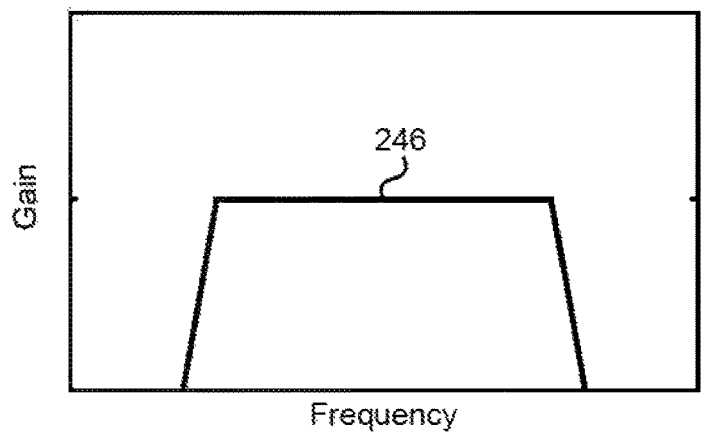

FIGS. 2B, 2C, and 2D illustrate frequency response graphs according to one implementation of the present application. It is noted that the frequency response graphs are merely exemplary, and are not intended to correspond to actual values. Accordingly, no units or scales are provided.

FIG. 2B may correspond to a single RF filter 236 being engaged in reconfigurable RF filtering module 280 of FIG. 2A. Accordingly, frequency response trace 242 in FIG. 2B is a relatively narrow bandpass. FIG. 2C may correspond to all RF filters 236 except one being engaged in reconfigurable RF filtering module 280. Accordingly, frequency response traces 244 and 245 in FIG. 2C form a bandstop. FIG. 2D may correspond to multiple RF filters 236 having adjacent passbands being engaged in reconfigurable RF filtering module 280. Accordingly, frequency response trace 246 in FIG. 2D is a relatively wide bandpass. The frequency response graphs in FIGS. 2B, 2C, and 2D demonstrate three different frequency responses that can be achieved using reconfigurable RF filtering module 280 in FIG. 2A. However, by using PCM RF switches 230 to engage and disengage RF filters 236, and by using implementations described above, numerous other reconfigurations and frequency responses can be achieved.

Figure 3A:
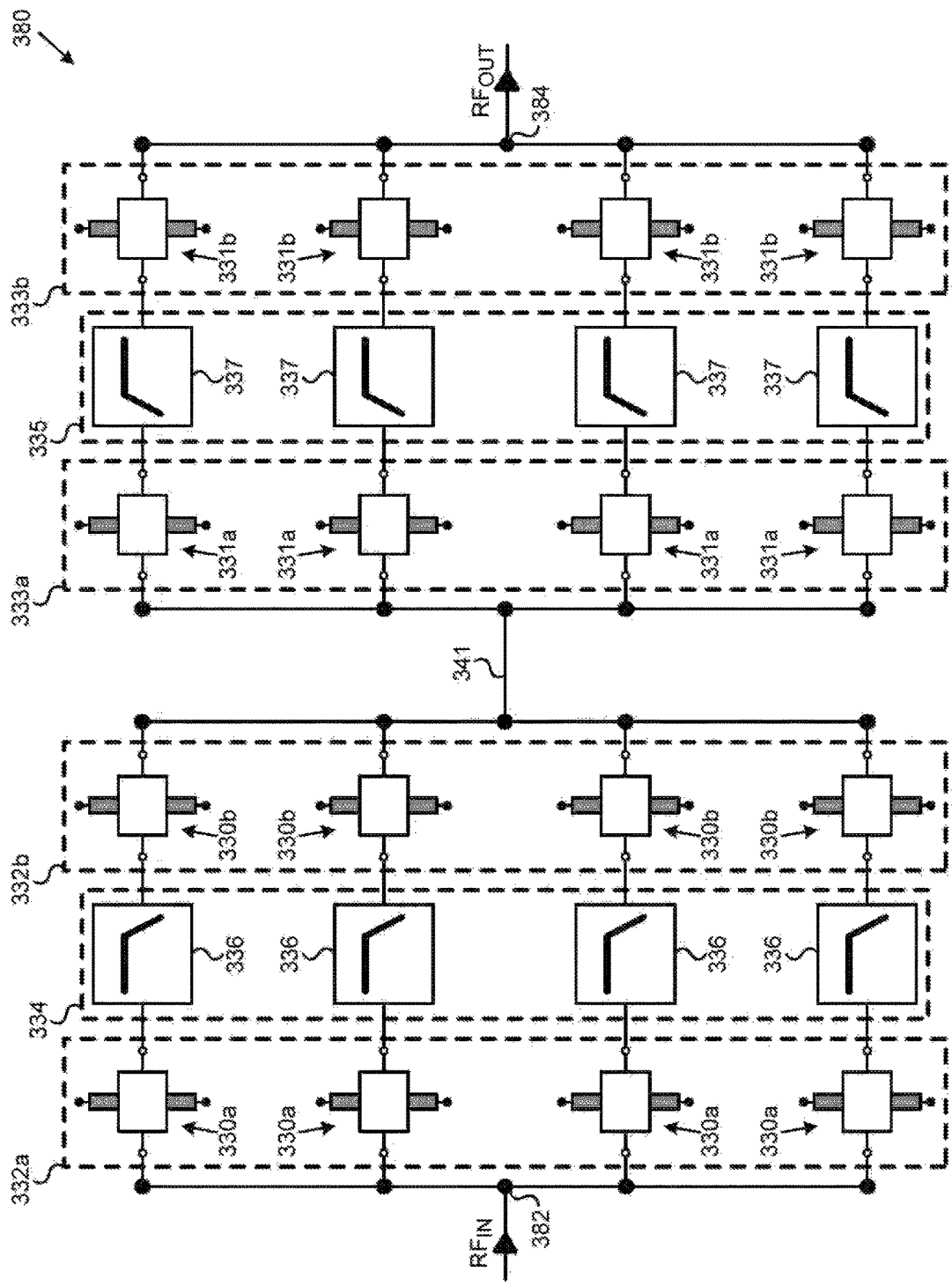
FIG. 3A illustrates a portion of a reconfigurable RF filtering module employing PCM RF switches according to one implementation of the present application.

FIG. 3A illustrates a portion of a reconfigurable RF filtering module employing PCM RF switches according to one implementation of the present application. In contrast to reconfigurable RF filtering module 280 in FIG. 2A, which includes a single PCM RF switch bank 232 and a single RF filter bank 234, reconfigurable RF filtering module 380 in FIG. 3A includes four PCM RF switch banks 332a, 332b, 333a, and 333b, and two RF filter banks 334 and 335.

PCM RF switches 330a in PCM RF switch bank 332a couple RF input 382 of reconfigurable RF filtering module 380 to respective RF filters 336 in RF filter bank 334. PCM RF switches 330b in PCM RF switch bank 332b couple respective RF filters in RF filter bank 334 to node 341. PCM RF switches 331a in PCM RF switch bank 333a couple node 341 to respective RF filters 337 in RF filter bank 335. PCM RF switches 331b in PCM RF switch bank 333b couple respective RF filters in RF filter bank 335 to RF output 384 of reconfigurable RF filtering module 380. PCM RF switches 330a, 330b, 331a, and 331b in FIG. 3A generally correspond to PCM RF switch 130 in FIG. 1, and may have any implementations or advantages described above.

As described above, RF filters 336 and 337 attenuate undesired frequencies, and can have different frequency responses. RF filters 336 and 337 can be engaged and disengaged by PCM RF switches 330a, 330b, 331a, and 331b in order to reconfigure reconfigurable RF filtering module 380. Notably, RF filters 336 and 337 PCM RF switches 330a, 330b, 331a, and 331b are in series configurations. In the present implementation, RF filters 336 in RF filter bank 334 are low-pass filters, while RF filters 337 in RF filter bank 335 are high-pass filters. For example, one RF filter 336 can be a low-pass filter passing frequencies below eight hundred megahertz (<800 MHz), while one RF filter 337 can be a high-pass filter passing frequencies above seven hundred megahertz (>700 MHz).

In the present implementation, RF filters 336 and 337 are also configured to be concurrently engaged by two corresponding PCM RF switches. That is, a PCM RF switch 330a and a corresponding PCM RF switch 330b are turned ON to engage an RF filter 336; likewise, a PCM RF switch 330a and a corresponding PCM RF switch 330b are turned OFF to disengage an RF filter 336. Similarly, a PCM RF switch 331a and a corresponding PCM RF switch 331b are turned ON to engage an RF filter 337; likewise, a PCM RF switch 331a and a corresponding PCM RF switch 331b are turned OFF to disengage an RF filter 337.

In various implementations, reconfigurable RF filtering module 380 can include more or fewer RF filter banks than shown in FIG. 3A. In various implementations, each RF filter bank can include more or fewer RF filters than shown in FIG. 3A. In various implementations, RF filters 336 and 337 may be any types of filters other than low-pass or high-pass.

Coupling multiple RF filter banks 334 and 335 as shown in FIG. 3A allows for reconfiguring reconfigurable RF filtering module 380 in stages. An input RF signal can receive a first stage of filtering by RF filter bank 334, and a second stage of filtering by RF filter bank 335. Thus, PCM RF switches 330a, 330b, 331a, and 331b can reconfigure reconfigurable RF filtering module 380 to exhibit frequency responses from two RF filters 336 and 337, as described further below. In one implementation, reconfigurable RF filtering module 380 can have an additional output at node 341 for measuring the RF signal after being filtered by RF filter bank 334. Because reconfigurable RF filtering module 380 utilizes PCM RF switches, it advantageously exhibits lower insertion loss, lower power consumption, and non-volatility compared to a reconfigurable RF filtering module using conventional switches, as described above. It is also noted that reconfiguring an RF filtering module in stages as shown in FIG. 3A generally multiplies insertion losses, and using conventional switches may render the module inoperable.

FIGS. 3B, 3C, 3D, and 3E illustrate frequency response graphs according to one implementation of the present application. It is noted that the frequency response graphs are merely exemplary, and are not intended to correspond to actual values. Accordingly, no units or scales are provided.

Figure 3B:
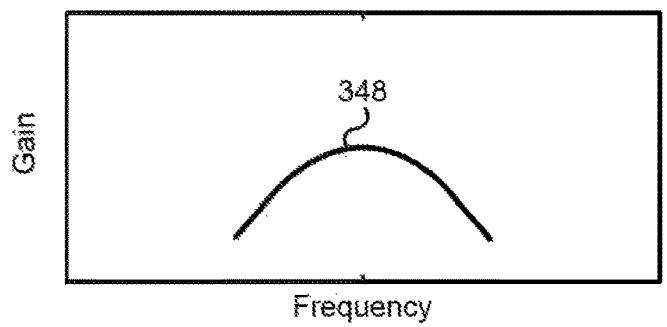
FIGS. 3B, 3C, 3D, and 3E illustrate frequency response graphs according to one implementation of the present application.

FIG. 3B may correspond to an RF filter 336 and an RF filter 337 being engaged in reconfigurable RF filtering module 380 in FIG. 3A. The engaged RF filter 336 is a low-pass filter having a first cutoff frequency and the engaged RF filter 337 is a high-pass filter having a second cutoff frequency close to the first cutoff frequency. Thus, frequency response trace 348 in FIG. 3B forms a relatively narrow bandpass.

Figure 3C:
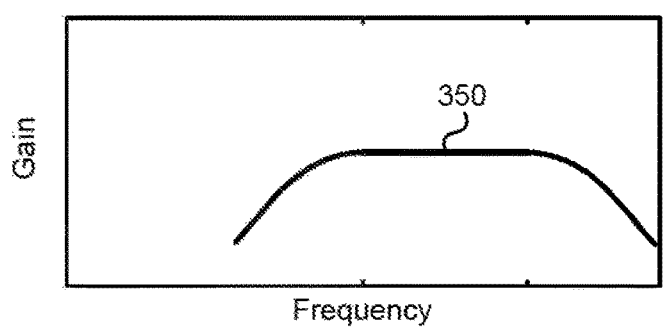

FIG. 3C may correspond to a different RF filter 337 being engaged in reconfigurable RF filtering module 380. In FIG. 3C, the engaged RF filter 336 is the same low-pass filter as in FIG. 3B, but the RF filter 337 is a different high-pass filter having a higher cutoff frequency. Thus, frequency response trace 350 in FIG. 3C forms a wider bandpass with a higher center frequency.

Figure 3D:
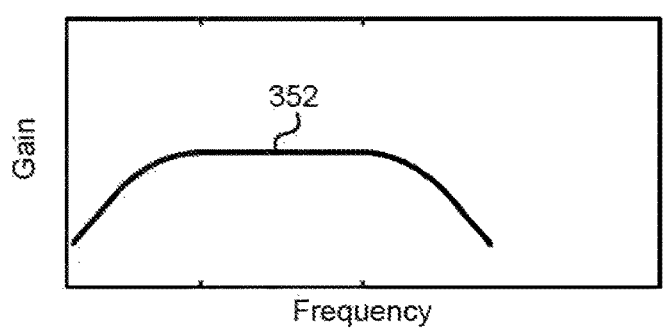

FIG. 3D may correspond to a different RF filter 336 being engaged in reconfigurable RF filtering module 380. In FIG. 3D, the engaged RF filter 337 is the same high-pass filter as in FIG. 3B, but the RF filter 336 is a different low-pass filter having a lower cutoff frequency. Thus, frequency response trace 352 in FIG. 3D forms a wider bandpass with a lower center frequency.

Figure 3E:
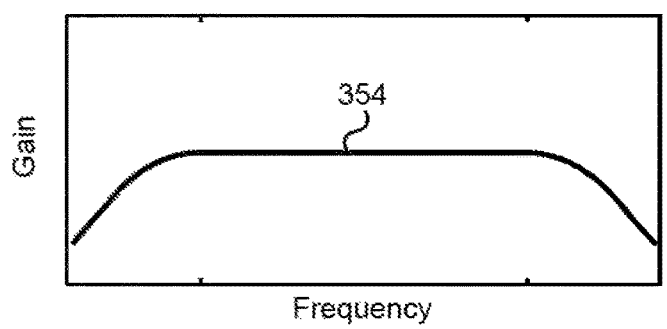

FIG. 3E may correspond to different RF filters 336 and 337 being engaged in reconfigurable RF filtering module 380. In FIG. 3E, the engaged RF filter 336 is a different low-pass filter with a cutoff frequency lower than that of the engaged RF filter 336 in FIG. 3B, and the engaged RF filter 337 is a different high-pass filter with a cutoff frequency higher than that of the engaged RF filter 337 in FIG. 3B. Thus, frequency response trace 354 in FIG. 3E forms a much wider bandpass. The frequency response graphs in FIGS. 3B, 3C, 3D, and 3E demonstrate four different frequency responses that can be achieved using reconfigurable RF filtering module 380 in FIG. 3A. However, by using PCM RF switches 330a, 330b, 331a, and 331b to engage and disengage RF filters 336 and 337, and by using implementations described above, numerous other reconfigurations and frequency responses can be achieved.

Figure 4:
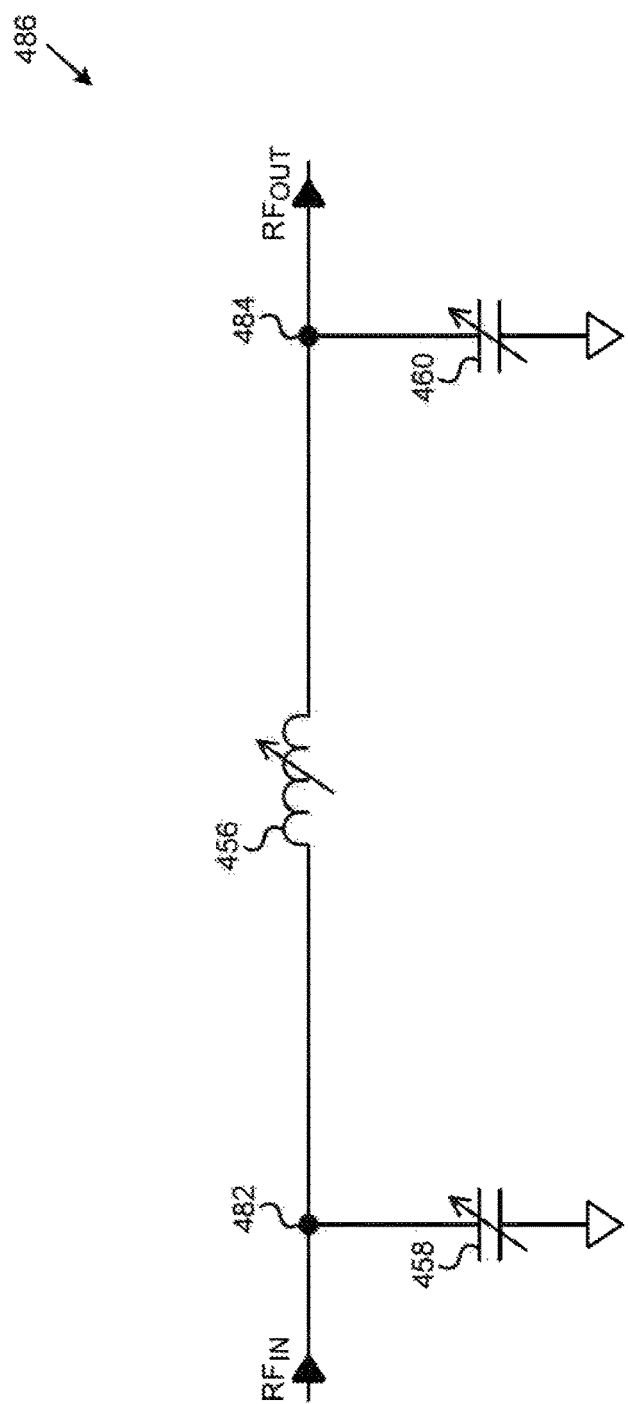
FIG. 4 illustrates a portion of a tunable RF filter according to one implementation of the present application.

FIG. 4 illustrates a portion of a tunable RF filter according to one implementation of the present application. Tunable RF filter 486 in FIG. 4 includes a variable inductor 456 and variable capacitors 458 and 460. Variable inductor 456 is coupled between RF input 482 and RF output 484. Variable capacitor 458 is coupled between RF input 182 and ground. Variable capacitor 460 is coupled between RF output 484 and ground. Tunable RF filter 486 attenuates undesired frequencies of input RF signals, and can be tuned to exhibit different frequency responses by varying the inductance and capacitance values of variable inductor 456 and variable capacitors 458 and 460. Techniques for varying inductance and capacitance values according to the present invention are described below.

Tunable RF filter 486 can be any other lumped element filter having variable passive components. In various implementations, tunable RF filter 486 can be an RC filter, an RL filter, or an RLC filter. In various implementations, tunable RF filter 486 can include more or fewer variable components than shown in FIG. 4. In various implementations, tunable RF filter 486 can couple components in a manner other than shown in FIG. 4.

Figure 5:
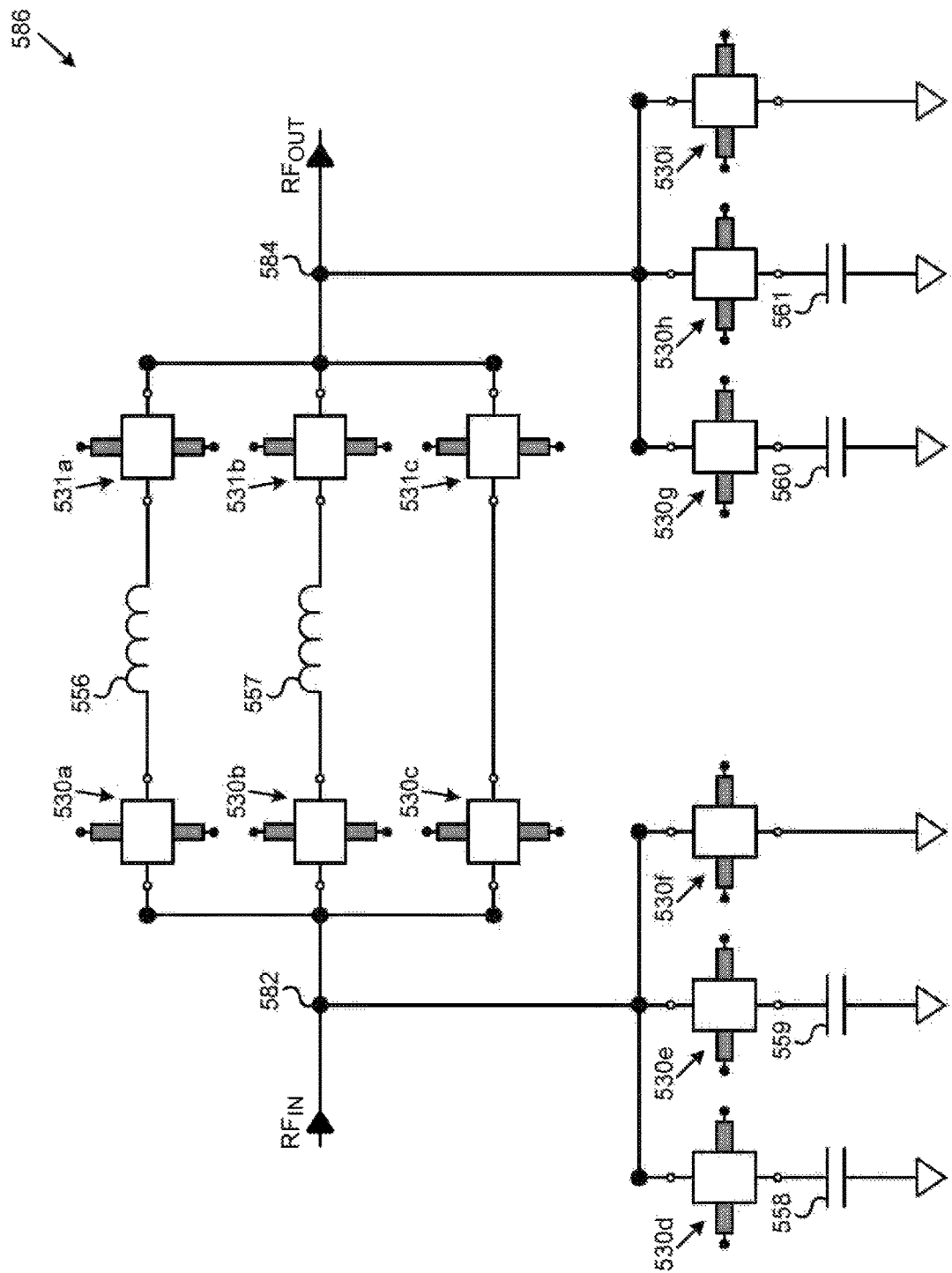
FIG. 5 illustrates a portion of a tunable RF filter employing PCM RF switches according to one implementation of the present application.

FIG. 5 illustrates a portion of a tunable RF filter employing PCM RF switches according to one implementation of the present application. In FIG. 5, multiple inductors, capacitors, and PCM RF switches are used as a means to implement variable inductor 456 and variable capacitors 458 and 460 in FIG. 4. Tunable RF filter 586 in FIG. 5 includes inductors 556 and 557, capacitors 558, 559, 560, and 561, and PCM RF switches 530a, 530b, 530c, 530d, 530e, 530f, 530g, 530h, 530i, 531a, 531b, and 531c.

PCM RF switches 530a, 530b, and 530c are coupled between RF input 582 and inductor 556, inductor 557, and PCM RF switch 531c respectively. Inductor 556 is coupled between PCM RF switches 530a and 531a. Inductor 557 is coupled between PCM RF switches 530b and 531b. Notably, inductors 556 and 557 and PCM RF switches 530a, 530b, 531a, and 531b are in series configurations. PCM RF switches 531a, 531b, and 531c are coupled to RF output 584. When PCM RF switches 530a and 531a are in an ON state, inductor 556 is engaged and a first inductance value can be achieved. Likewise, when PCM RF switches 530b and 531b are in an ON state, inductor 557 is engaged, and a second inductance value can be achieved. When PCM RF switches 530a, 531a, 530b, and 531b are in an ON state, both inductors 556 and 557 are engaged in parallel, and a third inductance value can be achieved. When PCM RF switches 530c and 531c are in an ON state, RF input 582 is coupled to RF output 584, and inductors 556 and 557 are bypassed. Thus, PCM RF switches 530a, 530b, 530c, 531a, 531b, and 531c in FIG. 5 achieve variable inductor 456 in FIG. 4.

PCM RF switches 530d, 530e, and 530f are coupled between RF input 582 of tunable RF filter 586 and capacitor 558, capacitor 559, and ground respectively. Capacitor 558 is coupled between PCM RF switch 530d and ground. Capacitor 559 is coupled between PCM RF switch 530e and ground. Notably, capacitors 558 and 559 and PCM RF switches 530d and 530e are in series configurations. When PCM RF switch 530d is in an ON state, capacitor 558 is engaged and a first capacitance value can be achieved. Likewise, when PCM RF switch 530e is in an ON state, capacitor 559 is engaged and a second capacitance value can be achieved. When PCM RF switches 530d and 530e are in an ON state, both capacitors 558 and 559 are engaged in parallel, and a third capacitance value can be achieved. When PCM RF switch 530f is in an ON state, RF input 582 is coupled to ground, and capacitors 558 and 559 are bypassed. Thus, PCM RF switches 530d, 530e, and 530f in FIG. 5 accomplish variable capacitor 158 in FIG. 4. Similarly, PCM RF switches 530g, 530h, and 530i in FIG. 5 accomplish variable capacitor 460 in FIG. 4. Tunable RF filter 586 in FIG. 5 can include more passive components capable of being engaged and disengaged by PCM RF switches in order to tune its frequency response in more combinations.

In contrast to reconfigurable RF filtering module 280 in FIG. 2A and reconfigurable RF filtering module 380 in FIG. 3A where multiple RF filters were used, tunable RF filter 586 in FIG. 5 has different frequency responses using a single tunable filter. Flexibility is achieved within tunable RF filter 586 itself. PCM RF switches 530a, 530b, 530c, 530d, 530e, 530f, 530g, 530h, 530i, 531a, 531b, and 531c are integrated in tunable RF filter 586. Additionally, tunable RF filter 586 in FIG. 5 generally has a small form factor because it utilizes multiple passive components rather than multiple RF filters to achieve a similar frequency response. Tunable RF filter 586 utilizes PCM RF switches according to the present invention which have low-loss and are non-volatile, as discussed above. Accordingly, compared to a tunable RF filter using conventional switches, tunable RF filter 586 advantageously has lower RF signal losses for a given tuning range, and consumes less power when components remain engaged.

Figure 6:
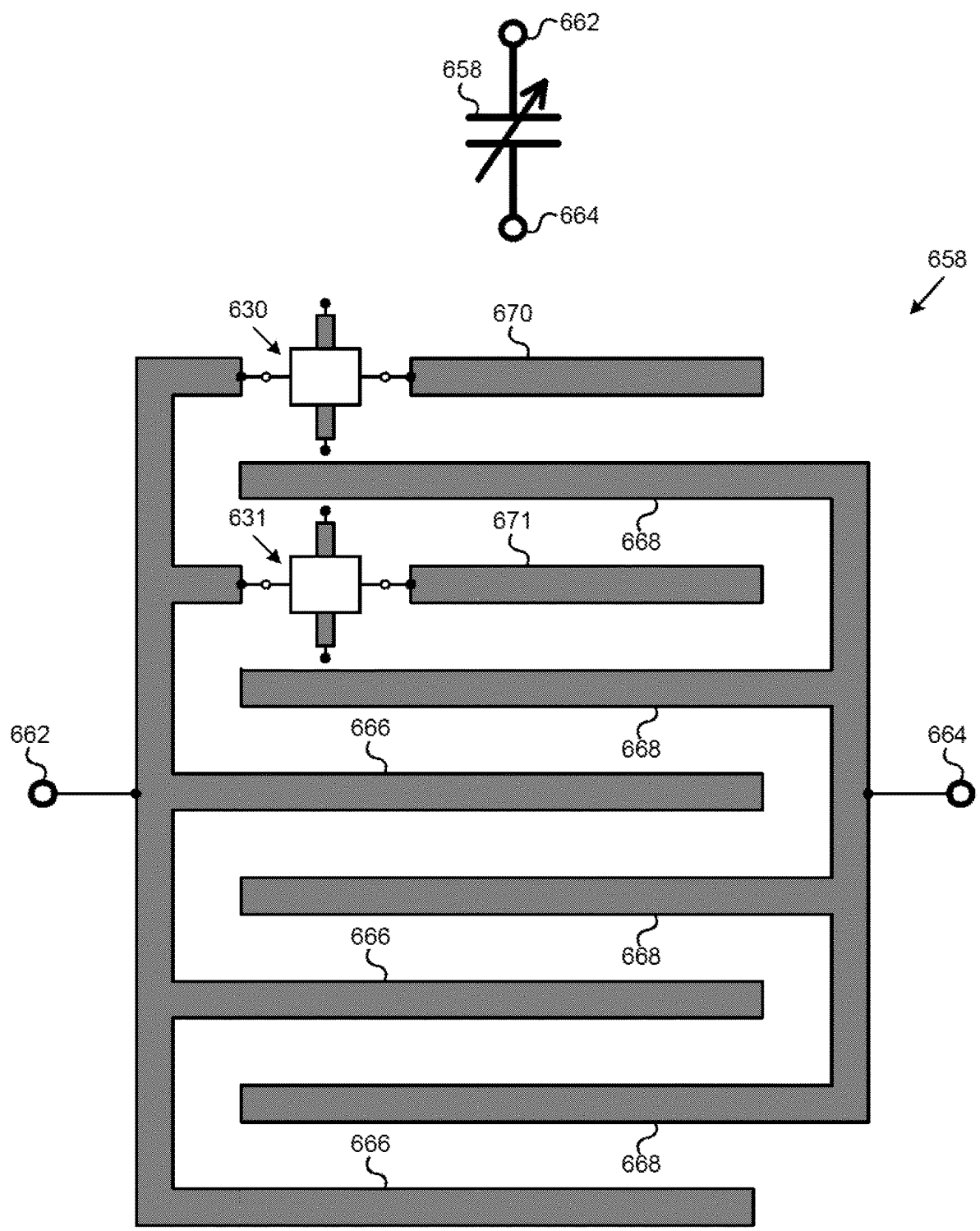
FIG. 6 illustrates a portion of an adjustable passive component employing PCM RF switches according to one implementation of the present application.

FIG. 6 illustrates a portion of an adjustable passive component employing PCM RF switches according to one implementation of the present application. Adjustable passive component 658 in FIG. 6 uses multiple segments and PCM RF switches to provide another technique to implement variable capacitor 458 or 460 in FIG. 4. Adjustable passive component 658 in FIG. 6 includes segments 666 and 668, PCM RF switches 630 and 631, selectable segments 670 and 671, and terminals 662 and 664.

In the present implementation, adjustable passive component 658 is an interdigitated capacitor. Segments 666 and 668 and selectable segments 670 and 671 are digits of the interdigitated capacitor. Segments 666 are connected to terminal 662, while segments 668 are connected to terminal 664. PCM RF switches 630 and 631 couple terminal 662 to selectable segments 670 and 671 respectively. Notably, selectable segments 670 and 671 and PCM RF switches 630 and 631 are in series configurations.

Selectable segments 670 and 671 can be engaged and disengaged by respective PCM RF switches 630 and 631. When selectable segments 670 and 671 are disengaged, their shapes and capacitance values effectively do not contribute to the overall shape and capacitance value of the interdigitated capacitor. Rather, the shape and capacitance value are governed by segments 666 and 668. When selectable segments 670 and 671 are engaged, their shapes and capacitance values are effectively added, and they increase the overall capacitance value of the interdigitated capacitor. Engaging both selectable segments 670 and 671 concurrently will increase the overall capacitance value more than engaging one of selectable segments 670 and 671. Adjustable passive component 658 can be included as part of an RF filter. For example, adjustable passive components can be used as variable capacitor 458 or 460 in tunable RF filter 486 in FIG. 4.

In various implementations, adjustable passive component 658 can include more or fewer segments 666 and 668 and/or more or fewer selectable segments 670 and 671. In various implementations, selectable segments 670 and 671 can have different sizes or shapes than shown in FIG. 6. In various implementations, selectable segments 670 and 671 can be asymmetrical and have different sizes or shapes from each other, such that adjustable passive component 658 can achieve coarser and finer adjustments. In various implementations, selectable segments 670 and 671 may be engaged by more than one PCM RF switch.

Although the description of the present implementation primarily focuses on adjusting capacitance values by engaging selectable segments 670 and 671, it is noted that segments 666 and 668 and selectable segments 670 and 671 each also have an inductance value and a resistance value, and that the overall inductance value of adjustable passive component 658 and the overall resistance value of adjustable passive component 658 may also be affected and/or purposely varied by engaging selectable segments 670 and 671.

Figure 7:
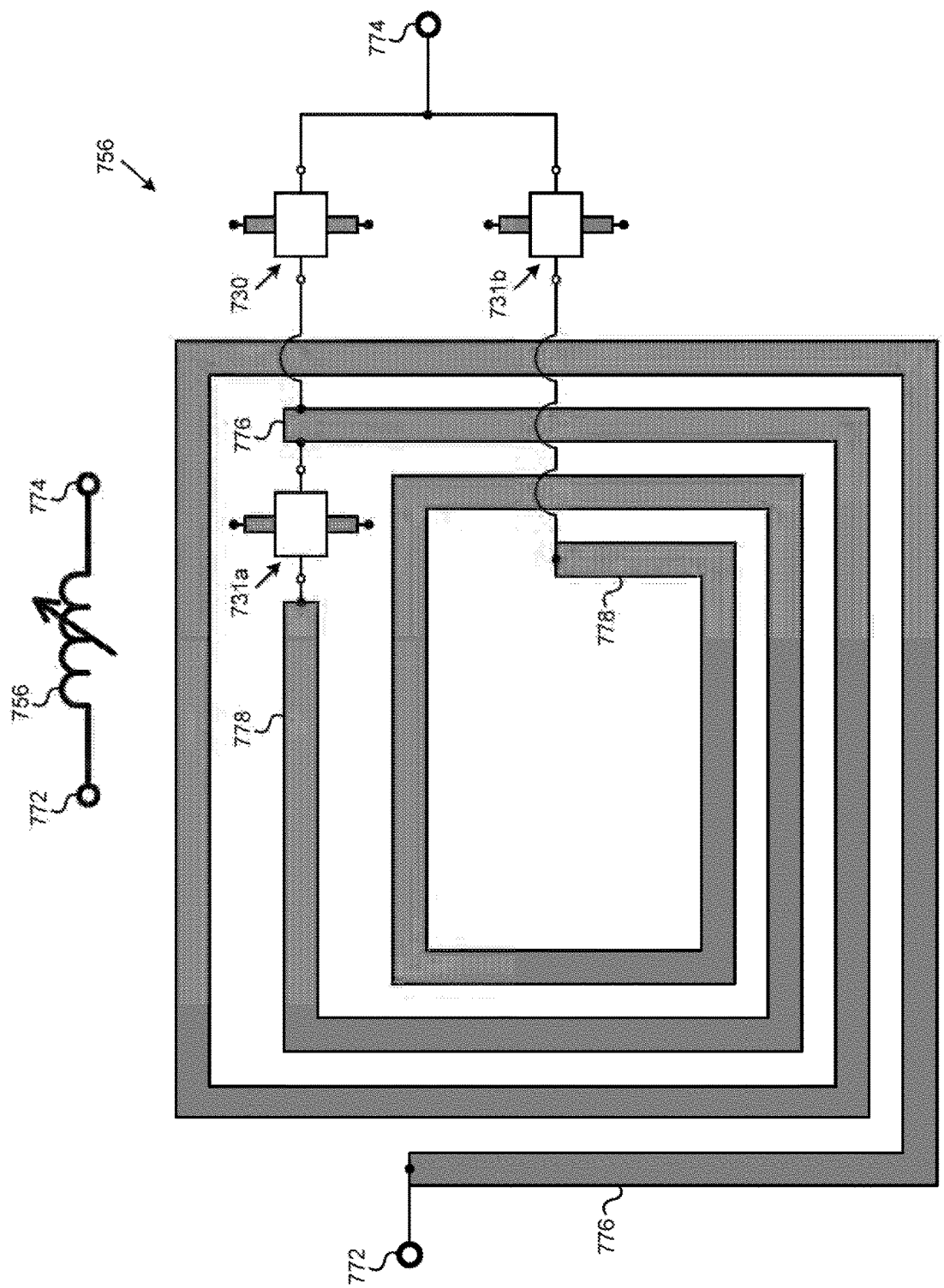
FIG. 7 illustrates a portion of an adjustable passive component employing PCM RF switches according to one implementation of the present application.

FIG. 7 illustrates a portion of an adjustable passive component employing PCM RF switches according to one implementation of the present application. Adjustable passive component 756 in FIG. 7 uses multiple segments and PCM RF switches to provide another means to accomplish variable inductor 456 in FIG. 4. Adjustable passive component 756 in FIG. 7 includes segment 776, PCM RF switches 730, 731*a*, and 731*b*, selectable segment 778 ("selectable segment 778" is short for "selectable spiral segment 778" in the present application), and terminals 772 and 774.

In the present implementation, adjustable passive component 756 is a spiral inductor. Segment 776 and selectable segment 778 are turns of the spiral inductor. Segment 776 and selectable segment 778 can comprise a metal, such as copper. The beginning of segment 776 is connected to terminal 772. The end of segment 776 is connected to PCM RF switches 730 and 731*a*. PCM RF switch 730 couples the end of segment 776 to terminal 774. PCM RF switch 731*a* couples the end of segment 776 to the beginning of selectable segment 778. PCM RF switch 731*b* couples the end of selectable segment 778 to terminal 774. Notably, selectable segment 778 and PCM RF switch 731*a* are in a series configuration.

Selectable segment 778 can be engaged and disengaged by PCM RF switches 730, 731*a*, and 731*b*. When PCM RF switch 730 is in an ON state and PCM RF switches 731*a* and 731*b* are in an OFF state, selectable segment 778 is disengaged, and its shape and inductance value effectively does not contribute to the overall shape and inductance value of the spiral inductor. Rather, the shape and inductance value are governed by segment 776. When PCM RF switch 730 is in an OFF state and PCM RF switches 731*a* and 731*b* are in an ON state, selectable segment 778 is engaged, and its shape and inductance value is effectively added, and it increases the overall inductance value of the spiral inductor. Adjustable passive component 756 can be included as part of an RF filter. For example, adjustable passive components can be used as variable inductor 456 in tunable RF filter 486 in FIG. 4.

In the implementation of FIG. 7, adjustable passive component 756 has a substantially square spiral pattern. In various implementations, adjustable passive component 756 may have any other patterns, such as a substantially circular spiral pattern, a substantially hexagonal spiral pattern, etc. In one implementation, the design of adjustable passive component 756 could be reversed such that segment 776 is situated near the center of a spiral and selectable segment 778 spirals outward. In various implementations, adjustable passive component 756 can include more or fewer selectable segments 778. In one implementation, a selectable segment 778 may refer to a single side of a turn, rather than to a whole turn or to multiple turns. In various implementations, selectable segment 778 can have different sizes or shapes than shown in FIG. 7. In various implementations, selectable segments 778 can be asymmetrical and have different sizes or shapes from each other, such that adjustable passive component 756 can achieve coarser and finer adjustments. In various implementations, selectable segment 778 may be engaged by more than one PCM RF switch.

Although the description of the present implementation primarily focuses on adjusting inductance values by engaging selectable segment 778, it is noted that segments 776 and selectable segment 778 each also have a capacitance value and a resistance value, and that the overall capacitance value of adjustable passive component 756 and the overall resistance value of adjustable passive component 756 may also be affected and/or purposely varied by engaging selectable segment 778.

Although the implementations provided above were directed to adjustable passive components that are adjustable capacitors or adjustable inductors, it is manifest the present application's PCM RF switches can be employed in a similar manner to achieve other adjustable passive components, such as adjustable resistors.

In contrast to tunable RF filter 586 in FIG. 5 where multiple passive components were used, a single adjustable passive component 658 (or 756) as shown in FIG. 6 (or FIG. 7) is used to achieve different frequency responses in an RF filter. Flexibility is achieved within adjustable passive component 658 (or 756) itself. PCM RF switches 630 and 631 (or 730, 731*a*, and 731*b*) are integrated in adjustable passive component 658 (or 756). Additionally, adjustable passive component 658 (or 756) generally has a smaller form factor because it utilizes multiple segments rather than multiple passive components. Adjustable passive component 658 (or 756) in FIG. 6 (or FIG. 7) utilizes PCM RF switches according to the present invention which have low-loss and are non-volatile, as discussed above. Accordingly, adjustable passive component 658 (or 756) in FIG. 6 (or FIG. 7) advantageously has lower RF signal losses for a given adjustment range, and also consumes less power.

Figure 8:
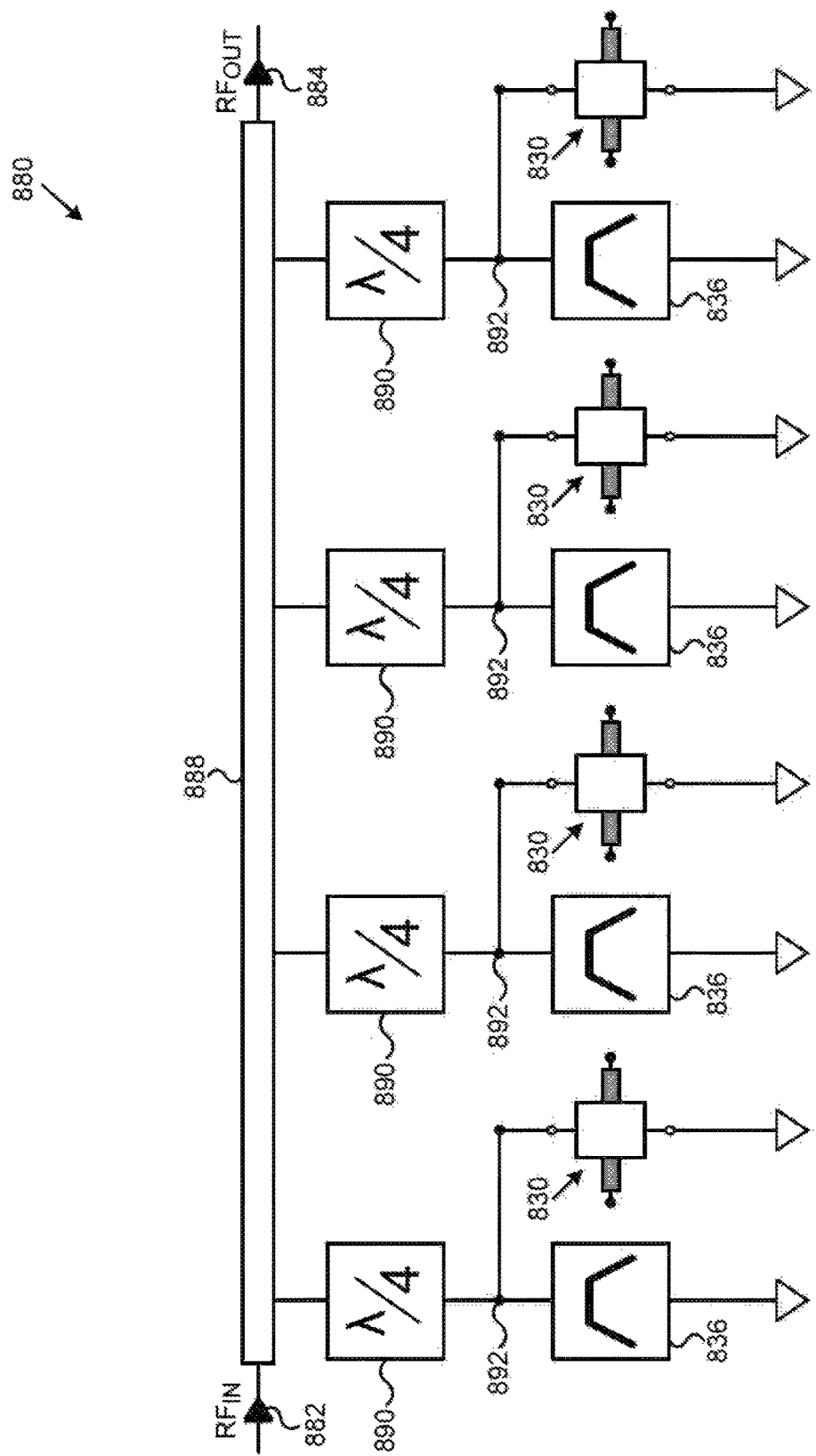
FIG. 8 illustrates a portion of a reconfigurable RF filtering module employing PCM RF switches according to one implementation of the present application.

FIG. 8 illustrates a portion of a reconfigurable RF filtering module employing PCM RF switches according to one implementation of the present application. In contrast to reconfigurable RF filtering module 280 in FIG. 2A, which includes PCM RF switches 230 in series configurations with RF filters 236, reconfigurable RF filtering module 880 in FIG. 8 includes PCM RF switches 830 in shunt configurations with RF filters 836. RF filtering module 880 includes RF line 888, quarter-wave transformers 890, RF filters 836, and PCM RF switches 830. RF filters 836 form an RF filter bank and PCM RF switches 830 form a PCM RF switch bank. As known in the art, quarter-wave transformer 890 refers to a quarter-wavelength impedance transformer, also referred to as a λ/4 transformer, which is a transmission line or a waveguide having a length substantially equal to one-quarter wavelength (λ) of the RF signal.

RF line 888 is coupled between RF input 882 of reconfigurable RF filtering module 880 and RF output 884 of reconfigurable RF filtering module 880. Quarter-wave transformers 890 are coupled between RF line 888 and respective nodes 892. RF filters 836 are coupled between respective nodes 892 and ground. PCM RF switches 830 are coupled in parallel with respective RF filters 836, between respective nodes 892 and ground. Quarter-wave transformers 890 can be any type of quarter-wave impedance transformer known in the art, such as microstrip, waveguide, or lumped element quarter-wave impedance transformers. RF filters 836 in FIG. 8 generally correspond to RF filters 236 in FIG. 2A, and may have any implementations or advantages described above. PCM RF switches 830 in FIG. 8 generally correspond to PCM RF switch 130 in FIG. 1, and may have any implementations or advantages described above.

In reconfigurable RF filtering module 880, each RF filter 836 is in a "shunt configuration" with a PCM RF switch 830. Each RF filter 836 is capable to be engaged and disengaged by a PCM RF switch 830. When PCM RF switch 830 is in an OFF state, an active segment of PCM is in an amorphous phase, has high resistivity, and does not easily conduct electrical current. An RF signal received at RF line 888 propagates across quarter-wave transformer 890 to RF filter 836. Accordingly, when PCM RF switch 830 is in an OFF state, PCM RF switch 830 engages RF filter 836.

When PCM RF switch 830 is in an ON state, the PCM is in a crystalline phase, has low resistivity, and is able to easily conduct electrical current. PCM RF switch 830 couples node 892 to ground. RF filter 836 is shunted. With proper impedance matching between quarter-wave transformer 890 and PCM RF switch 830, quarter-wave transformer 890 is seen as a very large impedance or as an open circuit to RF line 888. Thus, an RF signal received at RF line 888 does not propagate across quarter-wave transformer to RF filter 836. Accordingly, when PCM RF switch 830 is in an ON state, PCM RF switch 830 disengages RF filter 836.

As described above, when RF filter 836 is engaged, RF filter 836 attenuates undesired frequencies and passes desired frequencies from input RF signals to RF output 884. Thus, the frequency response of reconfigurable RF filtering module 880 is based on which RF filter 836 is engaged. In various implementation, reconfigurable RF filtering module 880 can be used in an RF receive chain or in an RF transmit chain. In various implementations, a PCM RF switch 830 can engage and disengage two or more RF filters 836.

A shunt configuration can also be employed in a tunable RF filter, such as tunable RF filter 586 in FIG. 5. For example, PCM RF switch 530*a* in FIG. 5 can be replaced with a quarter-wave transformer. A first PCM contact of a new PCM RF switch can be connected between the quarter-wave transformer and inductor 556. A second PCM contact of the new PCM RF switch can be connected to ground. Accordingly, inductor 556 and the new PCM RF switch would be in a shunt configuration.

Similarly, a shunt configuration can also be employed in an adjustable passive component, such as adjustable passive component 658 in FIG. 6 or adjustable passive component 756 in FIG. 7. For example, PCM RF switch 630 in FIG. 6 can be replaced with a quarter-wave transformer. A first PCM contact of a new PCM RF switch can be connected between the quarter-wave transformer and selectable segment 670. A second PCM contact of the new PCM RF switch can be connected to ground. Accordingly, selectable segment 670 and the new PCM RF switch would be in a shunt configuration.

Thus, various implementations of the present application achieve flexible RF filtering utilizing the inventive PCM RF switch of the present application and novel combinations to overcome the deficiencies in the art to lower insertion loss, lower power consumption, and provide non-volatility. From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A reconfigurable RF filtering module comprising:
a phase-change material (PCM) RF switch bank comprising PCM RF switches, wherein each of said PCM RF switches includes a PCM, PCM contacts situated on top of passive segments of said PCM and not situated on sides of said PCM, a heating element transverse to said PCM such that said PCM contacts situated on top of said passive segments of said PCM do not overlie said heating element, and a contact uniformity support layer situated on said PCM;
a radio frequency (RF) filter bank comprising RF filters;
each RF filter in said RF filter bank being capable to be engaged and disengaged in said reconfigurable RF filtering module by at least one PCM RF switch in said PCM RF switch bank.

2. The reconfigurable RF filtering module of claim 1, wherein said each RF filter and said at least one PCM RF switch are in a series configuration, and wherein said each RF filter is engaged by said at least one PCM RF switch when said PCM is in a crystalline phase, and wherein said each RF filter is disengaged by said at least one PCM RF switch when said PCM is in an amorphous phase.

3. The reconfigurable RF filtering module of claim 1, wherein said each RF filter and said at least one PCM RF switch are in a shunt configuration, and wherein said each RF filter is engaged by said at least one PCM RF switch when said PCM is in an amorphous phase, and wherein said each RF filter is disengaged by said at least one PCM RF switch when said PCM is in a crystalline phase.

4. The reconfigurable RF filtering module of claim 1, wherein said RF filters are selected from the group consisting of resonator filters, bulk acoustic wave (BAW) filters, surface acoustic wave (SAW) filters, LC filters, active filters, passive filters, cavity filters, waveguide filters, and lumped element filters.

5. The reconfigurable RF filtering module of claim 1, wherein said PCM includes an active segment approximately defined by said heating element;
wherein said each RF filter and said at least one PCM RF switch are in a series configuration;
wherein said each RF filter is engaged by said at least one PCM RF switch when said active segment is in a crystalline phase, and wherein said each RF filter is disengaged by said at least one PCM RF switch when said active segment is in an amorphous phase.

6. The reconfigurable RF filtering module of claim 1, wherein said PCM includes an active segment approximately defined by said heating element;
wherein said each RF filter and said at least one PCM RF switch are in a shunt configuration;
wherein said each RF filter is engaged by said at least one PCM RF switch when said active segment is in an amorphous phase, and wherein said each RF filter is disengaged by said at least one PCM RF switch when said active segment is in a crystalline phase.

7. The reconfigurable RF filtering module of claim 1, wherein said PCM contacts extend through said contact uniformity support layer.

8. A tunable RF filter comprising:
phase-change material (PCM) RF switches, wherein each of said PCM RF switches includes a PCM, PCM contacts situated on top of passive segments of said PCM and not situated on sides of said PCM, a heating element transverse to said PCM such that said PCM contacts situated on top of said passive segments of said PCM do not overlie said heating element, and a contact uniformity support layer situated on said PCM;
at least one capacitor and/or at least one inductor;
each of said at least one capacitor and/or said at least one inductor being capable to be engaged and disengaged in said tunable RF filter by at least one PCM RF switch of said PCM RF switches.

9. The tunable RF filter of claim 8, wherein said each of said at least one capacitor and/or said at least one inductor and said at least one PCM RF switch are in a series configuration, and wherein said each of said at least one capacitor and/or said at least one inductor is engaged by said at least one PCM RF switch when said PCM is in a crystalline phase, and wherein said each of said at least one capacitor and/or said at least one inductor is disengaged by said at least one PCM RF switch when said PCM is in an amorphous phase.

10. The tunable RF filter of claim 8, wherein said each of said at least one capacitor and/or said at least one inductor and said at least one PCM RF switch are in a shunt configuration, and wherein said each of said at least one capacitor and/or said at least one inductor is engaged by said at least one PCM RF switch when said PCM is in an amorphous phase, and wherein said each of said at least one capacitor and/or said at least one inductor is disengaged by said at least one PCM RF switch when said PCM is in a crystalline phase.

11. The tunable RF filter of claim 8, wherein said PCM includes an active segment approximately defined by said heating element;
wherein said each of said at least one capacitor and/or said at least one inductor and said at least one PCM RF switch are in a series configuration;
wherein said each of said at least one capacitor and/or said at least one inductor is engaged by said at least one PCM RF switch when said active segment is in a crystalline phase, and wherein said each of said at least one capacitor and/or said at least one inductor is disengaged by said at least one PCM RF switch when said active segment is in an amorphous phase.

12. The tunable RF filter of claim 8, wherein said PCM includes an active segment approximately defined by said heating element;
wherein said each of said at least one capacitor and/or said at least one inductor and said at least one PCM RF switch are in a shunt configuration;
wherein said each of said at least one capacitor and/or said at least one inductor is engaged by said at least one PCM RF switch when said active segment is in an amorphous phase, and wherein said each of said at least one capacitor and/or said at least one inductor is disengaged by said at least one PCM RF switch when said active segment is in a crystalline phase.

13. An adjustable passive component comprising:
multiple segments each having a shape, a capacitance value, an inductance value, and a resistance value;
at least one phase-change material (PCM) RF switch, wherein said at least one PCM RF switch includes a PCM, a heating element transverse to said PCM, and a contact uniformity support layer situated on said PCM;
a selectable individual digit or a selectable individual turn in said multiple segments being capable to be individually engaged and disengaged independently from all other digits or all other turns in said adjustable passive component by said at least one PCM RF switch;
wherein said selectable individual digit or said selectable individual turn and said at least one PCM RF switch are in a series configuration, such that said selectable individual digit or said selectable individual turn is individually engaged by said at least one PCM RF switch when said PCM is in a crystalline phase, and such that said selectable individual digit or said selectable individual turn is individually disengaged by said at least one PCM RF switch when said PCM is in an amorphous phase.

14. The adjustable passive component of claim 13, wherein said adjustable passive component is an interdigitated capacitor, and said selectable individual digit is a digit in said interdigitated capacitor.

15. The adjustable passive component of claim 13, wherein said adjustable passive component is a spiral inductor, and said selectable individual turn is a turn in said spiral inductor.

16. The tunable RF filter of claim 8, wherein said PCM contacts extend through said contact uniformity support layer.

17. The adjustable passive component of claim 13, wherein said selectable individual digit or said selectable individual turn is asymmetrical to another selectable individual digit or another selectable individual turn, such that said adjustable passive component can achieve coarser and finer adjustments.

18. The reconfigurable RF filtering module of claim 1, further comprising an interlayer dielectric situated on said contact uniformity support layer.

19. The tunable RF filter of claim 8, further comprising an interlayer dielectric situated on said contact uniformity support layer.

20. The adjustable passive component of claim 13, further comprising an interlayer dielectric situated on said contact uniformity support layer.

* * * * *